United States Patent
McCord et al.

(10) Patent No.: US 7,446,320 B1
(45) Date of Patent: Nov. 4, 2008

(54) ELECTRONICALLY-VARIABLE IMMERSION ELECTROSTATIC LENS

(75) Inventors: Mark A. McCord, Los Gatos, CA (US); Kirk J. Bertsche, San Jose, CA (US); Francisco Machuca, San Francisco, CA (US)

(73) Assignee: KLA-Tencor Technologies Corproation, Milpitas, CA (US)

( * ) Notice: Subject to any disclaimer, the term of this patent is extended or adjusted under 35 U.S.C. 154(b) by 450 days.

(21) Appl. No.: 11/260,586

(22) Filed: Oct. 26, 2005

Related U.S. Application Data

(60) Provisional application No. 60/709,199, filed on Aug. 17, 2005.

(51) Int. Cl.
*H01J 37/12* (2006.01)
*H01J 42/22* (2006.01)

(52) U.S. Cl. .................. 250/396 R; 250/397; 250/398
(58) Field of Classification Search ........................ None
See application file for complete search history.

(56) References Cited

U.S. PATENT DOCUMENTS

| | | | |
|---|---|---|---|
| 3,896,258 A | 7/1975 | Hanks | |
| 4,827,125 A | 5/1989 | Goldstein et al. | |
| 5,146,089 A * | 9/1992 | Rosien ................. | 250/309 |
| 5,598,002 A | 1/1997 | Todokoro et al. | |
| 5,717,204 A | 2/1998 | Meisburger et al. | |
| 5,973,323 A | 10/1999 | Adler et al. | |
| 6,087,659 A | 7/2000 | Adler et al. | |
| 6,104,034 A | 8/2000 | Frosien et al. | |
| 6,191,429 B1 | 2/2001 | Suwa | |
| 6,211,518 B1 | 4/2001 | Richaardson et al. | |
| 6,215,128 B1 | 4/2001 | Mankos et al. | |
| 6,380,546 B1 | 4/2002 | Petrov et al. | |
| 6,392,231 B1 * | 5/2002 | Chen ......................... | 250/310 |
| 6,407,387 B1 | 6/2002 | Frosien et al. | |
| 6,509,750 B1 | 1/2003 | Talbot et al. | |
| 6,515,287 B2 | 2/2003 | Notte, IV | |
| 6,710,340 B2 | 3/2004 | Kazumori | |
| 6,720,557 B2 | 4/2004 | Frosien | |
| 6,858,843 B1 | 2/2005 | Mankos et al. | |

OTHER PUBLICATIONS

Min Cheng, et al. "Optimization design of immersion magnetic lenses in projection electron beam lithography" International Journal for light and electron optics; Jan. 24, 2001, pp. 149-151; Jiaotong University. P.R. China.

Min Cheng, et al. "Study on wide beam curved optical axes focusing for magnetic immersed lenses without crossovers" International Journal for light and electron optics; May 28, 2000, pp. 509-513; Jiaotong University, P.R. China.

(Continued)

*Primary Examiner*—David A. Vanore
(74) *Attorney, Agent, or Firm*—Okamoto & Benedicto LLP

(57) ABSTRACT

One embodiment relates to an electronically-variable electrostatic immersion lens in an electron beam apparatus. The electrostatic immersion lens includes a top electrode configured with a first voltage applied thereto, an upper bottom electrode configured with a second voltage applied thereto, and a lower bottom electrode configured with a third voltage applied thereto. The third voltage is controlled separately from the second voltage. Other embodiments are also disclosed.

13 Claims, 6 Drawing Sheets

OTHER PUBLICATIONS

Min Cheng, et al. "Curvilinear-axis focusing and aberration theory of wide electron beams for combined immersion magnetic-electrostatic lens systems" International Journal of light and electron optics; Feb. 5, 2001 pp. 259-267; Jiaotong University, P.R. China.

M. Mankos, et al. "Multisource optimization of a column for electron lithography" J.Vac. Sci. Technology B, Nov./Dec. 2000, pp. 3010-3016, vol. 18, No. 6; Etec Systems, Hayward, California U.S.A.

* cited by examiner

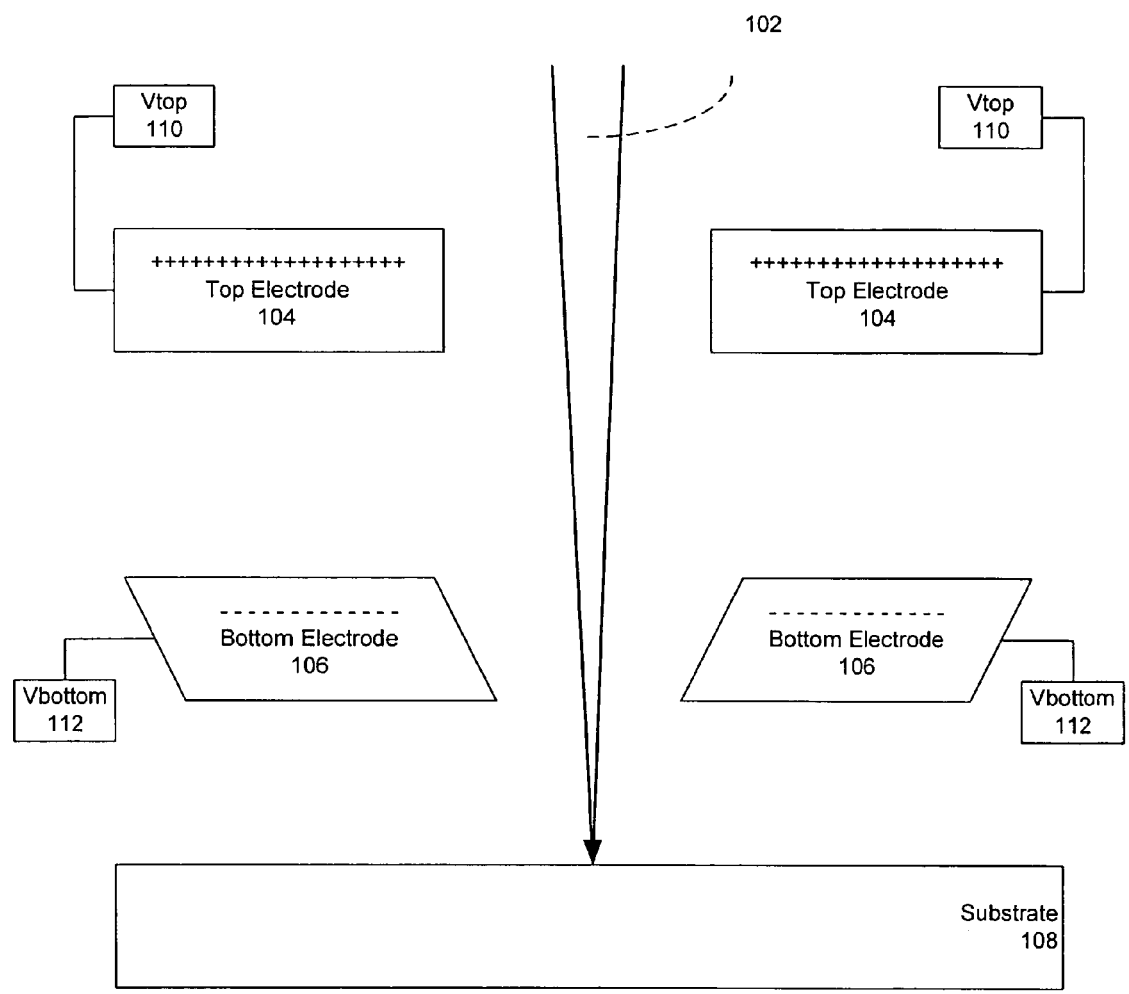
FIG. 1
(Conventional)

ELECTRONICALLY-VARIABLE IMMERSION ELECTROSTATIC LENS

CROSS-REFERENCE TO RELATED APPLICATIONS

The present invention claims the benefit of U.S. Provisional Patent Application No. 60/709,199 entitled "Electronically-variable Immersion Electrostatic Lens," filed Aug. 17, 2005 by inventors Mark A. McCord, Kirk J. Bertsche, and Francisco Machuca, the disclosure of which is hereby incorporated by reference.

BACKGROUND OF THE INVENTION

1. Field of the Invention

The present invention relates generally to electron beam apparatus, and more particularly with immersion electrostatic lenses in electron beam apparatus.

2. Description of the Background Art

Electron beam instruments are utilized for various purposes, including inspection, review and metrology of substrates in semiconductor manufacturing. Electron beam instruments typically include, among other components, an electron gun or source, condenser lenses, beam deflectors and an objective lens.

The objective lens is configured to focus the incident electron beam onto the substrate being examined. Objective lenses may utilize magnetic or electrostatic means to focus the incident beam. Some objective lenses are immersion lenses which are configured close to the substrate surface and have short focal distances.

BRIEF DESCRIPTION OF THE DRAWINGS

FIG. 1 is a schematic diagram of a conventional electrostatic immersion lens in an electron beam apparatus.

SUMMARY

Figure 2:
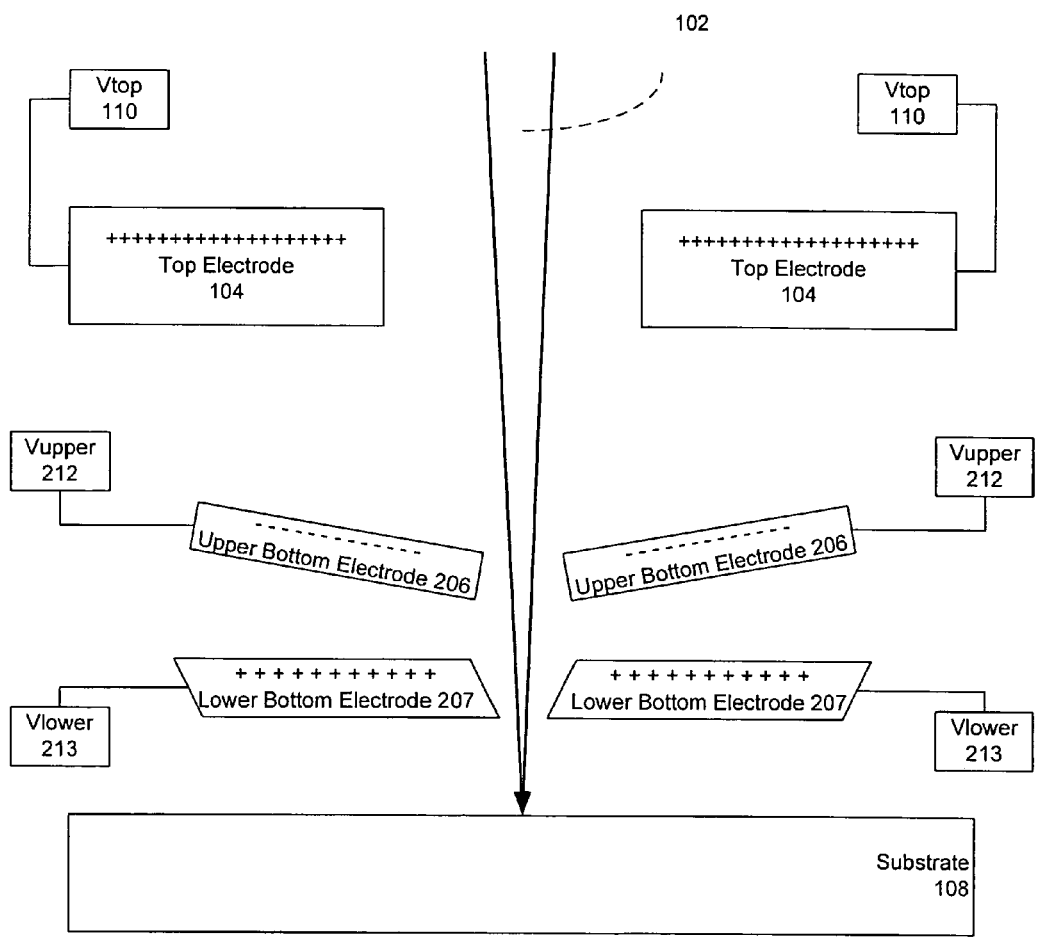
FIG. 2 is a schematic diagram of an electronically-variable electrostatic immersion lens in an electron beam apparatus in accordance with an embodiment of the invention.

One embodiment relates to an electronically-variable immersion lens in an electron beam apparatus. The electrostatic immersion lens includes a top electrode configured with a first voltage applied thereto, an upper bottom electrode configured with a second voltage applied thereto, and a lower bottom electrode configured with a third voltage applied thereto. The third voltage is controlled separately from the second voltage. In alternate embodiments, the top electrode may be replaced by another device, such as an n-pole deflector or a beam accelerator tube.

Another embodiment pertains to a method of focusing an electron beam onto a substrate using an immersion lens. A first voltage is applied to a top electrode. A second voltage is applied to a upper bottom electrode, and a third voltage is applied to a lower bottom electrode. The third voltage is controlled separately from the second voltage.

Other embodiments are also disclosed.

DETAILED DESCRIPTION

An example of a conventional electrostatic immersion lens is depicted in cross-sectional view in FIG. 1. The conventional electrostatic immersion lens is configured to focus an incident electron beam 102 onto the surface of a substrate 108 using a top electrode 104 and a bottom electrode 106. A first voltage, Vtop, supplied by a first voltage controller or supply 110 to the top electrode 104, and a second voltage, Vbottom, is supplied by a second voltage controller or supply 112 to the bottom electrode 106. The substrate voltage is also controlled. The first voltage Vtop is typically positive relative to the substrate voltage, and the second voltage Vbottom is typically negative to the substrate voltage.

The conventional electrostatic immersion lens provides bottom electrode 106 with a fixed bore size and thickness, and a single voltage is applied thereto. The bore size and thickness of the electrode 106 is defined by the geometry of its mechanical construction and so cannot be readily varied. As such, the conventional electrostatic immersion lens is restricted to fairly limited ranges of landing energy, surface field, and field of view. Sometimes the bottom electrode 106 may be split into two parts, but a single voltage is still supplied thereto.

Hence, conventional electrostatic immersion lenses lack flexibility to operate optimally over a wide range of different landing energies, surface field conditions, fields of view. In other words, while a conventional electrostatic immersion lens may attempt to cover a wide range of conditions, such a conventional lens will suffer some compromise in optics range or performance.

To overcome the above-discussed disadvantage, an electron beam column may be configured with changeable electrodes in the electrostatic immersion lens. Such electrodes may be changed out with a service call to a technician. Each set of such interchangeable electrodes may correspond to a particular range of operating conditions. However, mechanically replacing electrodes via service calls is cumbersome and introduces undesirable delays.

The present application discloses a technique for increasing the operational flexibility of an electrostatic immersion lens without needing to mechanically replace electrodes. This disclosed technique provides an electronically-variable means for extending the range of operating conditions of an electrostatic immersion lens. Such an electronically-variable electrostatic immersion lens may be used for automated wafer inspection or review, or for metrology, among other uses.

FIG. 2 is a schematic diagram of an electronically-variable electrostatic immersion lens in an electron beam apparatus in accordance with an embodiment of the invention. Unlike the conventional lens of FIG. 1, the lens of FIG. 2 includes multiple (at least two) independently-controlled bottom electrodes.

In the particular embodiment illustrated in FIG. 2, there are two independently-controlled bottom electrodes, an "upper" bottom electrode 206 and a "lower" bottom electrode 207. An upper voltage, Vupper, is supplied to the upper bottom electrode 206 by a first bottom voltage controller or supply 212, and a lower voltage, Vlower, is supplied to the lower bottom electrode 207 by a second bottom voltage controller or supply 213. In other words, the bottom electrode 106 and single voltage controller 112 of the conventional lens in FIG. 1 is replaced with two electrodes (206 and 207) and two independently-controlled high voltage supplies (212 and 213).

In accordance with an embodiment of the present invention, by electronically varying the ratio of the voltages on the two bottom electrodes (206 and 207), the electron-optical effect of the electrostatic immersion lens may be optimized to suit a variety of operating conditions (without need for mechanical changes to the lens). In other words, the disclosed electrostatic immersion lens may be electronically varied with similar effect as changing the physical geometry (for example, bore size and/or thickness) of a conventional electrostatic immersion lens.

Advantageously, the configuration of FIG. 2 allows an electron beam column to operate across a wider range of conditions (landing energies, surface fields, and fields of view) than the conventional configuration of FIG. 1. By extending the usable range of operating conditions for the electron beam apparatus, defect image contrast may be increased, leading to improved defect detectability and/or measurability.

In addition, as discussed further below, by putting a negative voltage on the upper bottom electrode 206 (negative relative to the substrate potential), the disclosed lens may be used as an energy filter such that only higher-energy electrons are passed farther up the column to a detector. This energy filter functionality may be used to further increase contrast, for example, by rejecting secondary electrons that do not add to the defect signal.

Figure 3:
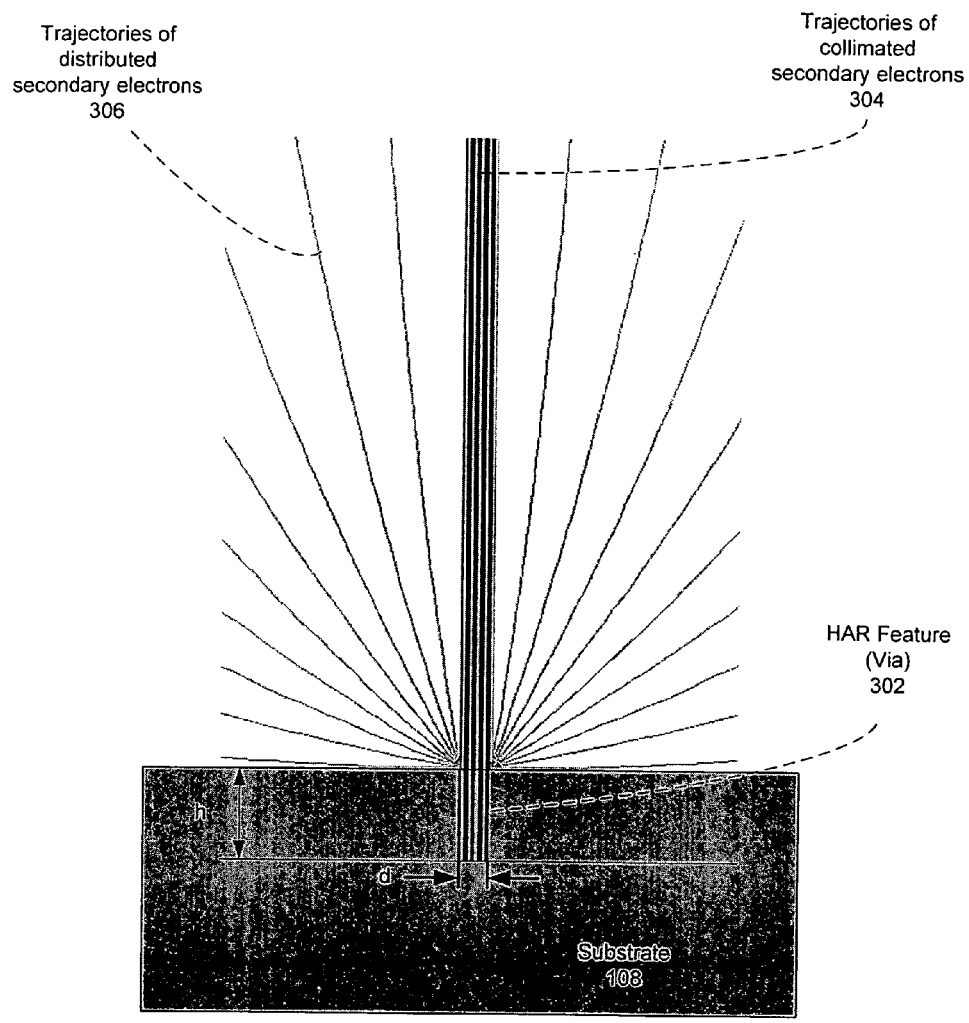
FIG. 3 is a schematic diagram depicting simulated secondary electron trajectories near a semiconductor substrate surface when an incident electron beam impinges upon a high aspect ratio (HAR) feature.

FIG. 3 is a schematic diagram depicting simulated secondary electron trajectories near a semiconductor substrate surface due to impingement of an incident electron beam upon a high aspect ratio (HAR) feature 302. In this example, the HAR feature 302 has a depth h of 60 microns and a diameter d of 20 microns.

The secondary electron trajectories are shown as they are emitted from the substrate surface. In particular, collimated electron trajectories 304 are shown for secondary electrons emitted from within the HAR feature 302, and distributed electron trajectories 306 are depicted for secondary electrons emitted from the surface area surrounding the HAR feature 302. In this particular simulated example, the collimated electrons 304 have energies from fifty electron volts to fifty-nine electron volts (50 eV to 59 eV), and the distributed electrons 306 have energies from one electron volt to fifty electron volts (1 eV to 50 eV).

The initial electron trajectories in the vicinity near the surface are depicted in FIG. 3. The subsequent electron trajectories as the electrons travel back up the electron beam column through the double bottom electrodes are shown in FIG. 4.

Figure 4:
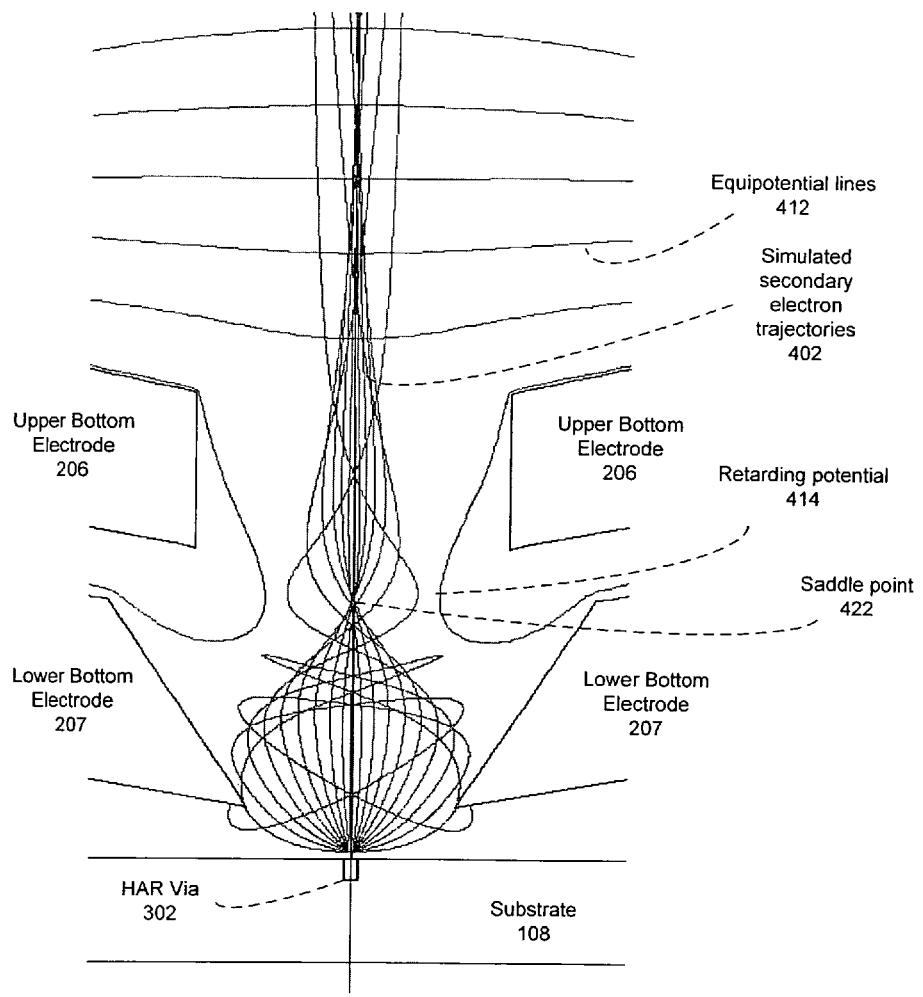
FIG. 4 is a schematic diagram depicting the simulated electron trajectories from around the HAR feature as the electrons travel through the dual bottom electrodes of the electrostatic immersion lens in accordance with an embodiment of the invention.

Shown in FIG. 4 are electrostatic equipotential lines 412, including the equipotential line forming the retarding potential 414 due to the relatively negative voltage on the upper bottom electrode 206. As seen in FIG. 4, the retarding potential 414 causes the secondary electron trajectories 402 to generally for a saddle point 422. The saddle point 422 comprises a point (or vicinity around a point) at which the trajectories converge in their paths through the dual bottom electrodes (206 and 207).

Figure 5:
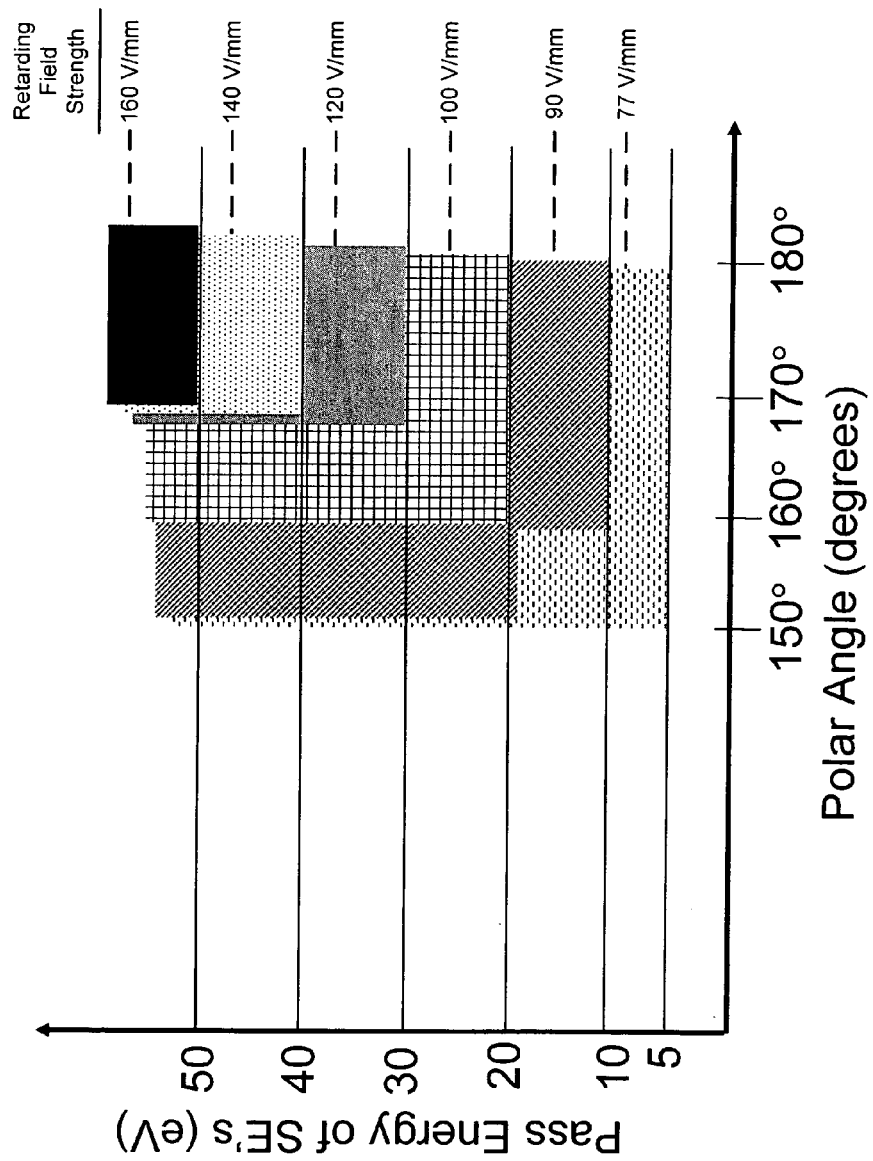
FIG. 5 is a filter character plot of according to the simulations of the electrostatic immersion lens with dual bottom electrodes.

FIG. 5 is a filter character plot of according to the simulations of the electrostatic immersion lens with dual bottom electrodes. At each of various retarding field strengths, energies sufficient to pass the retarding field so as to travel further up the column are plotted in dependence of the polar angle of the electron trajectories (in the range of 150 degrees to 180 degrees. Here, secondary electron trajectories normal to the substrate surface and traveling directly up the column have a polar angle of 180 degrees. In other words, the polar angle in FIG. 5 is relative the trajectory of the incident beam, such that 180 degrees is directly opposite in direction compared with the incident beam.

In particular, at a retarding field strength of 77 V/mm, the pass energy required is plotted as 5 eV for trajectories at polar angles from 150 to 180 degrees. At a retarding field strength of 90 V/mm, the pass energy required is plotted as 20 eV for trajectories at polar angles from 150 to 160 degrees and as 10 eV for trajectories at polar angles from 160 to 180 degrees. At a retarding field strength of 100 V/mm, the pass energy required is plotted as 20 eV for trajectories at polar angles from 160 to 180 degrees. At a retarding field strength of 120 V/mm, the pass energy required is plotted as 30 eV for trajectories at polar angles from about 165 to 180 degrees. At a retarding field strength of 140 V/mm, the pass energy required is plotted as 40 eV for trajectories at polar angles from about 166 to 180 degrees. At a retarding field strength of 160 V/mm, the pass energy required is plotted as 50 eV for trajectories at polar angles from about 167 to 180 degrees.

Figure 6:
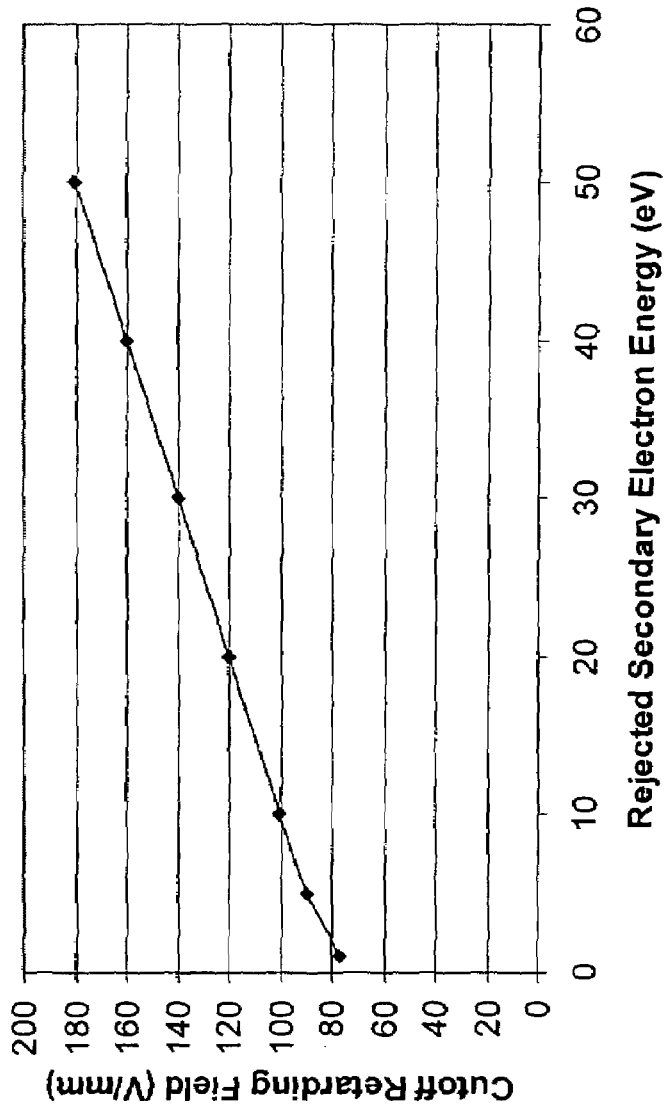
FIG. 6 is a plot showing the retarding field required to cut-off secondary electrons of a given energy according to simulations of an electrostatic immersion lens with dual bottom electrodes.

FIG. 6 is a plot showing the retarding field required to cut-off secondary electrons of a given energy for all polar angles according to simulations of an electrostatic immersion lens with dual bottom electrodes. The plot shows that the cut-off retarding field goes from below 80 V/mm for secondary electrons of energies of only a few electron volts and steadily increases to 180 V/mm for secondary electrons of energies near 50 eV.

Hence, as shown by FIGS. 5 and 6, the electronically-variable electrostatic immersion lens as disclosed herein has the additional filtering functionality. The filtering functionality may be used to reject secondary electrons below a threshold electron energy. The threshold electron energy is shown in FIG. 6 as being dependent upon the retarding field strength.

In another embodiment of the invention, the above-discussed electronically-variable electrostatic objective lens may be combined with a magnetic objective lens. In other words, the objective lens may include both electrostatic and magnetic lenses.

In alternate embodiments of the invention, the top electrode 104 may be replaced by other devices which serve a similar functionality. For example, instead of a top electrode 104, an octopole or n-pole deflector may be positioned above the upper bottom electrode 206. Such a deflector may be configured to influence the electrons similarly to a top electrode 104. As another example, instead of a top electrode 104, a beam accelerator tube may be positioned above the upper bottom electrode 206. Such a beam accelerator tube may also be configured to influence the electrons similarly to a top electrode 104.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electronically-variable electrostatic objective lens for focusing an electron beam using electrostatic fields in an electron beam apparatus, the electrostatic objective lens comprising:
   a first voltage controller configured to supply a first voltage which is positive relative to a potential of a target substrate;
   a top electrode of the electrostatic objective lens configured with the first voltage applied thereto;
   a second voltage controller configured to supply a second voltage which is negative relative to the potential of the target substrate;
   an upper bottom electrode of the electrostatic objective lens configured with the second voltage applied thereto;
   a third voltage controller configured to supply a third voltage which is positive relative to the potential of the target substrate; and
   a lower bottom electrode of the electrostatic objective lens configured with the third voltage applied thereto,
   wherein the top electrode, the upper bottom electrode, and the lower bottom electrode, together, form the electrostatic objective lens.

2. The electrostatic objective lens of claim 1, wherein the electrostatic objective lens further comprises a magnetic lens component.

3. An electron beam apparatus including an electronically-variable electrostatic objective lens for focusing an incident beam upon a substrate surface, wherein the electronically-variable electrostatic objective lens comprises a first voltage controller configured to supply a first voltage which is positive relative to a substrate potential, a top electrode configured with the first voltage applied thereto, a second voltage controller configured to supply a second voltage which is negative relative to the substrate potential; an upper bottom electrode configured with a second voltage applied thereto, the second voltage being negative relative to the substrate potential, a third voltage controller configured to supply a third voltage which is positive relative to the substrate potential, and a lower bottom electrode configured with a third voltage applied thereto.

4. A method of focusing an electron beam onto a substrate using an electrostatic objective lens formed by a top electrode, an upper bottom electrode, and a lower bottom electrode, the method comprising:
   supplying a first voltage which is positive relative to a potential of the substrate;
   applying the first voltage to the top electrode of the electrostatic objective lens;
   supplying a second voltage which is negative relative to the potential of the substrate;
   applying the second voltage to the upper bottom electrode of the electrostatic objective lens; and
   supplying a third voltage which is positive relative to the potential of the substrate; and
   applying the third voltage to the lower bottom electrode of the electrostatic objective lens,
   wherein the third voltage is controlled separately from the second voltage.

5. The method of claim 4, wherein the second and third voltages are set such that secondary electrons trajectories converge in a vicinity of a saddle point.

6. The method of claim 4, wherein the method is performed by an automated inspection or review instrument with a result of increasing contrast of a high-aspect-ratio feature under inspection or review.

7. The method of claim 4, wherein the method is performed by a critical dimension scanning electron microscope (CD SEM) instrument with a result of increasing contrast of a high-aspect-ratio feature being measured.

8. The method of claim 4, wherein the second voltage applied to the upper bottom electrode forms a retarding potential.

9. The method of claim 8, wherein the retarding potential filters out secondary electrons below a threshold energy which is dependent on the retarding potential.

10. An electronically-variable electrostatic objective lens in an electron beam apparatus, the electrostatic objective lens comprising:
    an electron source;
    a device positioned between the source and a target substrate and configured to accelerate electrons;
    a first high voltage supply configured to output a first voltage which is negative relative to a potential of the target substrate;
    an first electrode of the electrostatic objective lens positioned between the device and the target substrate and configured with the first voltage applied thereto;
    a second high voltage supply configured to output a second voltage which is positive relative to the potential of the target substrate; and
    a second electrode of the electrostatic objective lens positioned between the upper electrode and the target substrate and configured with the second voltage applied thereto,
    wherein the second high voltage supply is controlled separately from the first high voltage supply so as to achieve the electronically-variable electrostatic objective lens.

11. The electrostatic objective lens of claim 10, wherein the device comprises an n-pole deflector.

12. The electrostatic objective lens of claim 1, wherein the device comprises a beam accelerator tube.

13. The electrostatic objective lens of claim 10, wherein the device comprises a third voltage supply configured to output a third voltage which is positive relative to the potential of the target substrate, and a third electrode of the electrostatic objective lens configured with the third voltage applied thereto.

* * * * *